US006613669B2

(12) United States Patent
Taguwa

(10) Patent No.: US 6,613,669 B2
(45) Date of Patent: Sep. 2, 2003

(54) SEMICONDUCTOR DEVICE AND METHOD FOR MANUFACTURING THE SAME

(75) Inventor: Tetsuya Taguwa, Tokyo (JP)

(73) Assignee: NEC Electronics Corporation, Kawasaki (JP)

( * ) Notice: Subject to any disclaimer, the term of this patent is extended or adjusted under 35 U.S.C. 154(b) by 87 days.

(21) Appl. No.: 09/801,550

(22) Filed: Mar. 8, 2001

(65) Prior Publication Data

US 2001/0046789 A1 Nov. 29, 2001

(30) Foreign Application Priority Data

Mar. 10, 2000 (JP) ........................................ 2000-066462

(51) Int. Cl.$^7$ .............................................. H01L 21/44
(52) U.S. Cl. ..................... 438/653; 438/250; 438/253; 438/393; 438/396; 438/656; 438/685; 438/687
(58) Field of Search ................................ 438/250, 253, 438/393, 396, 627, 643, 648, 653, 656, 685, 687

(56) References Cited

U.S. PATENT DOCUMENTS

| 5,899,724 | A | * | 5/1999 | Dobuzinsky et al. | ........ 438/384 |
| 6,008,869 | A | | 12/1999 | Oana et al. | |
| 6,100,188 | A | * | 8/2000 | Lu et al. | ............... 438/653 |
| 6,294,420 | B1 | * | 9/2001 | Tsu et al. | ................... 438/239 |
| 6,432,844 | B1 | * | 8/2002 | Farrar | ....................... 438/783 |
| 6,440,849 | B1 | * | 8/2002 | Merchant et al. | ........... 438/658 |

FOREIGN PATENT DOCUMENTS

| JP | 8-220562 | 8/1996 |
| KR | 1996-0026993 | 7/1996 |

OTHER PUBLICATIONS

Singer et al, , Mat. Res. Soc Proc., vol. 100, 1988, 201–206.*

* cited by examiner

Primary Examiner—Matthew Smith
Assistant Examiner—V. Yevsikov
(74) Attorney, Agent, or Firm—Katten Muchin Zavis Rosenman

(57) ABSTRACT

A barrier metal that can be used in a semiconductor is to be made extremely thin. Further, the manufacturing steps of a semiconductor device are shortened to reduce its manufacturing cost. An insulating layer (e.g., a thermal nitride layer 10) with good step coverage formed on a surface of a conductor film such as lower electrodes 9 and 9a of a capacitor on a semiconductor substrate is transformed into a reformed layer 11, which serves as a conductive barrier layer. Alternatively, the insulating layer formed on the surface of the insulating layer on the semiconductor substrate is totally or partially reformed into the conductive barrier layer. This reforming process is conducted by heating the above-mentioned semiconductor substrate at a predetermined temperature and, applying a plasma-excited high melting-point metal onto the surface of the above-mentioned insulating layer. This high melting-point metal may be Ti, Ta, Ni, Mo, W or the like.

6 Claims, 8 Drawing Sheets

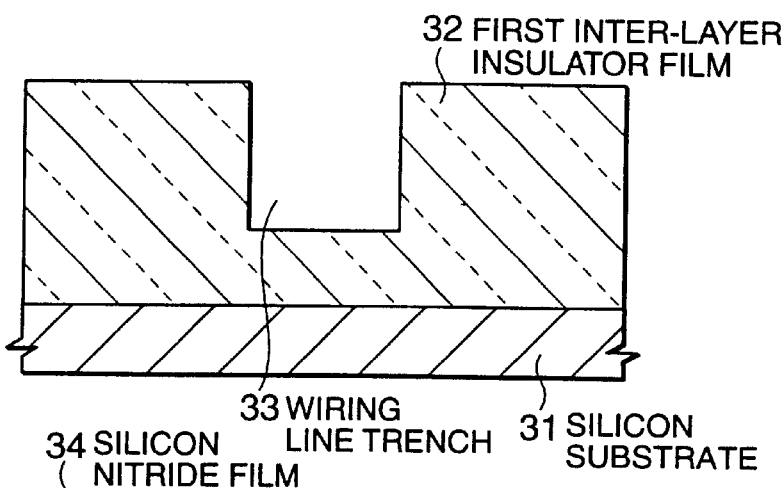
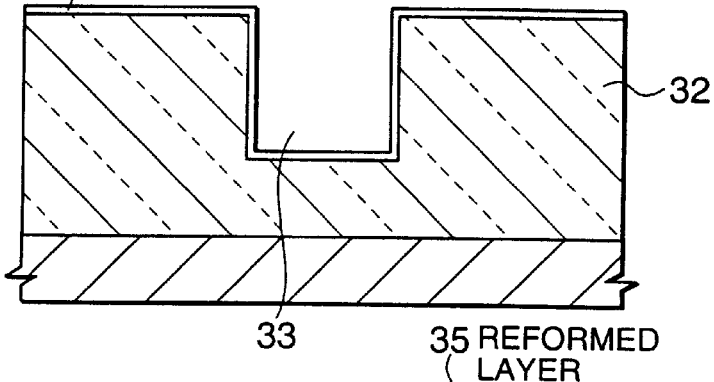
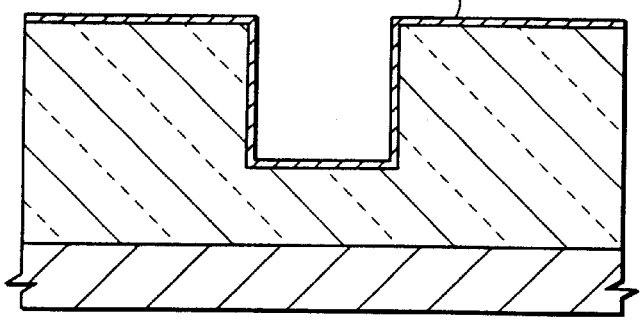
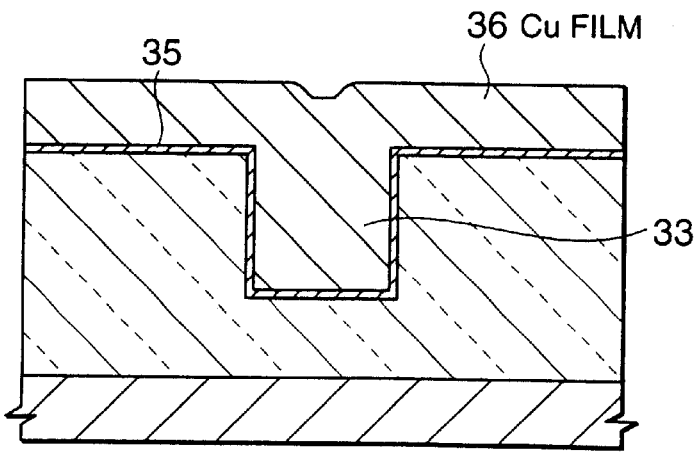

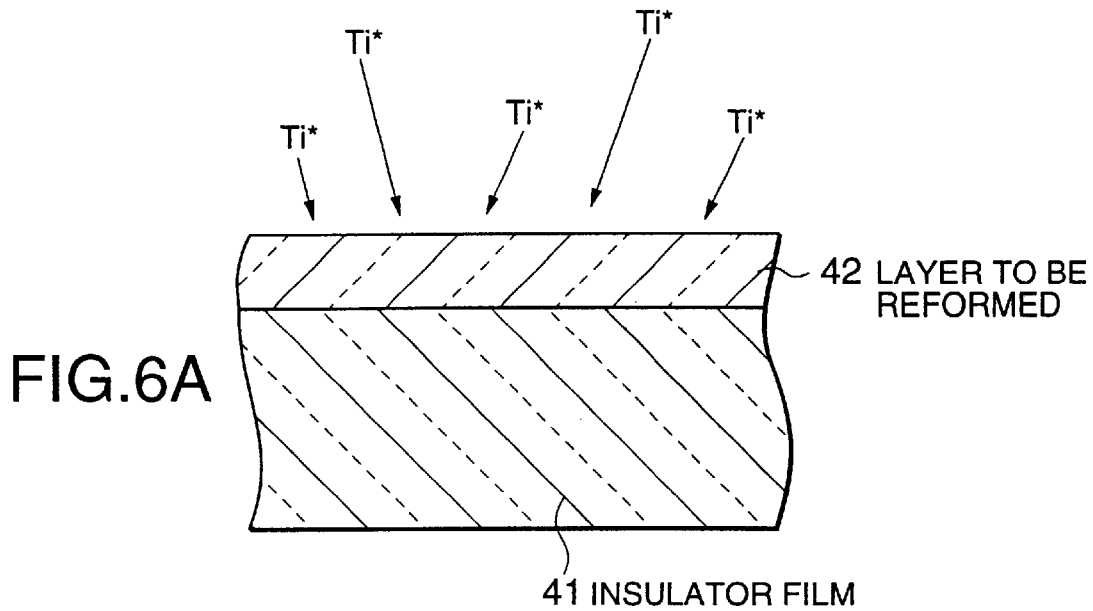
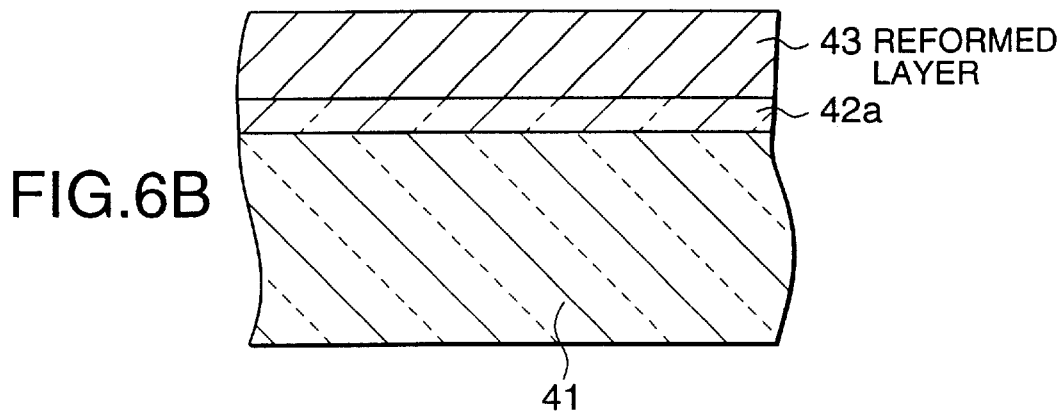

SEMICONDUCTOR DEVICE AND METHOD FOR MANUFACTURING THE SAME

BACKGROUND OF THE INVENTION

1. Field of the Invention

The present invention relates to a semiconductor device and a method for manufacturing the same and, more particularly, to an extremely thin barrier metal structure and a method for manufacturing the same.

2. Description of the Related Art

The fine patterning and the integration density of semiconductor device structures are still energetically being improved. As for the fine patterning, presently, a design rule of 0.10 µm for semiconductor elements is discussed in various ways, so that DRAMs, ultra-high speed logic ICs, and their hybrid ULSI semiconductor devices based on this design rule are being studied and developed.

To improve the integration density, operation speed, and multifarious-functioning and also to reduce the power dissipation of such semiconductor devices, it is very important to form an extremely thin barrier metal.

For example, with increasing integration densities of ULSIs, copper (Cu) or Cu alloys are more effectively used as a conductive layer of a trench wiring line (also called damascene wiring line). In this case, however, it is indispensable to provide a barrier metal for preventing this Cu material from being diffused. Moreover, with improving fine patterning of the wiring line, it is required to make the barrier metal film extremely thin, i.e. 5 nm or less.

In an opening (connection via hole or contact hole) for interconnection of wiring line layers in a multi-layer wiring line structure, the barrier metal film having a extremely thin thickness is indispensable as this opening is also more and more fine patterned.

Further, also in the case of DRAM memory cells each including one transistor and one capacitor, an extremely thin barrier metal is indispensable in formation of this capacitor.

The following will describe in detail the case of the DRAM memory cell with reference to the drawings. FIG. 1A to FIG. 1C are schematic cross-sectional views of sequential steps for manufacturing a pair of the above-mentioned memory cells in its memory-cell array.

As shown in FIG. 1A, an element-isolating insulator film 102 is formed in a predetermined region on the surface of a P conductivity-type silicon substrate 101. This element-isolating insulator film 102 is formed by a well-known trench-element-isolating method. In an element's active region surrounded by this element-separating insulator film 102 are formed a pair of insulated gate field effect transistors (MOSFETs) constituting the above-mentioned transistor, the gate electrodes of which provide word lines 103 and 103a.

Further, to the word lines 103 and 103a is introduced an N-type impurity in a self-alignment manner, to thereby form a bit-line-diffused layer 104 as well as diffused layers 105 and 105a for connecting capacitors. The bit-line-diffused layer 104 is connected via a contact plug 106 to a bit line 107. Also, the diffused layers 105 and 105a are connected via connection holes formed in a first inter-layer insulator film 108 respectively to lower electrodes 109 and 109a of the capacitor. Those lower electrodes 109 and 109a are formed by patterning a polycrystalline silicon (poly-silicon) film containing a phosphorus impurity.

Next, as shown in FIG. 1B, a dielectric insulator film 110 is formed on the lower electrodes 109 and 109a as adhered thereon. As this dielectric insulator film, a highly dielectric material with a relatively high dielectric constant is used. This highly dielectric insulator film may be made of, for example, a tantalum oxide film ($Ta_2O_5$ film), strontium titanate film (STO film), barium-strontium titanate film (BST film), or lead zirconate titanate film (PZT film).

Next, as shown in FIG. 1C, a titanium nitride film 111 and a tungsten silicide film 112 are formed by sputtering. Then, they are patterned by well-known photo-resist and dry etching technologies to form a cell plate. Thus, a pair of capacitors is formed which comprises the lower electrodes 109 and 109a, the dielectric insulator film 110, and the above-mentioned cell plate.

Then, a second inter-layer insulator film 113 including a silicon oxide film is formed so as to cover the whole surface.

In the case of a trench wiring line made of Cu or a Cu alloy, the Cu material thereof must be coated with a barrier metal film to prevent its diffusing. If, for example, a prior art technology using a titanium nitride film as the barrier metal is employed, however, its film thickness must be 20 nm or more. Such a film thickness order of the barrier metal may increase the resistance of the wiring line to thus deteriorate the performance of the semiconductor device as the wiring line is decreased in width. This is because such a barrier metal has a higher specific resistance than Cu. This problem holds true also with the formation of a barrier metal in the above-mentioned opening.

Also, a silicon nitride film may be used as the above-mentioned diffusion preventing film and is effective as a barrier for the trench wiring line. When it is connected to another wiring line or electrode, however, the silicon nitride film cannot be applied as is because it is an insulator film; thus requiring complicated process steps.

On the other hand, a highly dielectric material used as the dielectric insulator film of the capacitor shown in FIG. 1 has generally a low heat-resistant, and oxygen contained in this highly dielectric film is diffused at a temperature of about 800° C., thus very easily reducing the capacitance of the capacitor and deteriorating its insulation.

Therefore, a barrier metal film needs to be interposed between the lower electrode and the dielectric insulator film indispensably. If, however, a titanium nitride film is used as the barrier metal as in a prior art, it is necessary to have a large film thickness, so that the spacing between the lower electrodes 109 and 109a mentioned with the prior art cannot be reduced. In consequence, the area of a memory cell is increased by that much so that a highly dielectric material such as mentioned above cannot effectively be applied on the dielectric insulator film of the capacitor.

SUMMARY OF THE INVENTION

Accordingly, one object of the invention is to provide an extremely thin barrier metal that can prevent oxygen from being diffused from a highly dielectric material employed.

Another object of the invention is to provide an extremely thin barrier metal that can be used on a trench wiring line or a connection opening through which wiring line layers are interconnected.

Yet another other object of the invention is to shorten the required manufacturing process steps and reduce the costs for manufacturing the semiconductor device.

According to one feature of the present invention, there is provided on a semiconductor device in which an insulating layer formed on the surface of a conductor film of a semiconductor substrate is reformed into a conductive barrier layer.

According to another feature of the present invention, there is provided a semiconductor device in which part or the whole of an insulating layer formed on a surface of an insulator film on the semiconductor substrate is reformed into a conductive barrier layer.

In the above mentioned semiconductor devices, the insulating layer is preferably a silicon nitride film and the conductive barrier layer is preferably a metal compound of high melting-point metal, silicon (Si) and nitrogen (N). The high melting-point metal is a metal selected from a group consisting of titanium (Ti), tantalum (Ta), Nickel (Ni), molybdenum (Mo) and tungsten (W).

Alternatively, the insulating layer is preferably a silicon nitride film, and the conductive barrier layer is preferably made of Ti—Si—N with a ratio of 25–35 atomic percent of Ti, 30–40 atomic percent of Si, and 30–40 atomic percent of N.

Further, the conductor film may be a lower electrode of a capacitor. In this case, a dielectric film of the capacitor is adhered on the upper surface of the conductive barrier layer, and an upper electrode, that is, a cell plate of the capacitor is formed on the surface of the dielectric film. The dielectric film may be a tantalum oxide film, a strontium titanate film, a barium-strontium titanate film, or lead zirconate titanate film.

Moreover, the insulator film may constitute an inter-insulator film, so that the conductive barrier layer is formed on a side wall of a wiring line trench provided in a predetermined region of this inter-layer insulator film. A metal material is filled in the wiring line trench via the conductive barrier, thus forming a trench wiring line in the inter-layer insulator film. Preferably, the metal material is copper (Cu).

According to yet another feature of the present invention, there is provided a method of manufacturing a semiconductor device, which comprises the steps of forming a conductor film on a semiconductor substrate and then adhering an insulating layer on the surface of the conductor film, and applying an active species (an active species means plural active species of one kind) of a high melting-point metal onto the surface of the insulating layer under a condition of heating the semiconductor substrate to thereby reform the insulating layer into a conductive barrier layer.

According to further another feature of the present invention, there is provided a method of manufacturing a semiconductor device, which comprises the steps of forming an insulator film on a semiconductor substrate and then adhering an insulating layer on the surface of the insulator film, and applying an active species of a high melting-point metal onto the surface of the above-mentioned insulating layer under a condition of heating the semiconductor substrate to thereby reform part or the whole of the above-mentioned insulating layer into a conductive barrier layer.

According to more another feature of the present invention, there is provided a method of manufacturing a semiconductor device, which comprises the steps of patterning a poly-silicon film to thereby form the lower electrode of the capacitor of the semiconductor device on its semiconductor substrate, transforming by thermal nitridation the surface of the lower electrode into a silicon nitride layer, applying an active species of a high melting-point metal onto the surface of the silicon nitride layer under a condition of heating the semiconductor substrate to thereby reform the silicon nitride layer into a conductive barrier layer, and stacking and forming a dielectric insulator film and an upper electrode of the capacitor on the conductive barrier layer, in sequence.

According to yet another feature of the present invention, there is provided a method of manufacturing a semiconductor device, which comprises the steps of forming an inter-layer insulator film on a semiconductor substrate and then a wiring line trench in a predetermined region of the inter-layer insulator film, forming an insulating layer which covers both an inside wall of the wiring line trench and the inter-layer insulator film, applying an active species of a high melting-point metal onto the surface of the insulating layer under a condition of heating the semiconductor substrate to thereby reform part or the whole of the insulating layer into a conductive barrier layer, forming a film of a metal material which fills the wiring line trench via the conductive barrier layer, and performing chemical-mechanical polishing on the above-mentioned metal material.

In the above mentioned methods of manufacturing semiconductor devices, preferably, the active species of the high melting-point metal may be produced by plasma-exciting or photo-exciting a halogen compound of this high melting-point metal. The high melting-point metal is preferably titanium (Ti), tantalum (Ta), nickel (Ni), Molybdenum (Mo), or tungsten (W). Alternatively, the insulating layer is preferably a silicon nitride film, while the high melting-point metal compound is preferably titanium tetra-chloride.

By the methods for manufacturing the semiconductor devices according to the invention, the temperature for heating the semiconductor substrate during the application of the active species may set at 400° C. or higher, 1000° C. or lower. Further, to reform efficiently by the active species the substrate temperature of 500° C. or higher is preferable, and 800° C. or lower substrate temperature is preferable considering the thermal stress affect to other portions of the device.

The features of the present invention resides in that an amorphous insulating layer is once formed on the conductor film or insulator film on the semiconductor substrate and then reformed into a conductive barrier layer. Generally, the insulating layer can be easily formed by Chemical Vapor Deposition (CVD) and, moreover, thus formed insulating layer has excellent step coverage.

Therefore, the conductive barrier layer formed by reforming the insulating layer has very good step coverage. Moreover, generally, thus formed conductive barrier layer is amorphous in contrast to the poly-crystallized structure of a barrier metal formed by the prior art, thus greatly improving the barrier effects. This is because while the poly-crystallized structure involves the diffusion of oxygen or copper through a grain boundary, the amorphous structure has no grain boundary therein, so that the diffusion through such grain boundary can completely be inhibited.

Further, the above-mentioned insulating layer can be easily controlled in film thickness, which permits greatly facilitating the formation of the extremely thin insulating layer, hence that of the conductive barrier layer.

BRIEF DESCRIPTION OF THE DRAWINGS

FIG. 5A to FIG. 5F are cross-sectional views showing sequential steps for manufacturing a capacitor to thereby explain a second embodiment of the invention; and FIGS. 6A and 6B are schematic cross-sectional views explaining yet another method for forming a reformed layer by use of a metal.

DESCRIPTION OF THE PREFERRED EMBODIMENTS

First Embodiment

The following will describe a first embodiment of the invention with reference to FIG. 2. FIG. 2A to FIG. 2E are cross-sectional views showing sequential steps for manufacturing a pair of DRAM memory cell array. Here, the structure according to the present invention will be described with reference to these cross-sectional views of the above-mentioned manufacturing steps.

Figure 1A:
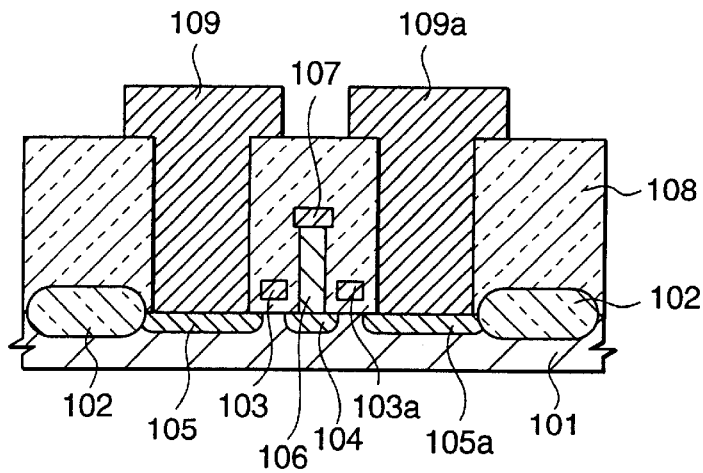
FIG. 1A to FIG. 1C are cross-sectional views showing sequential steps for manufacturing a capacitor according to a prior art.
Figure 1B:
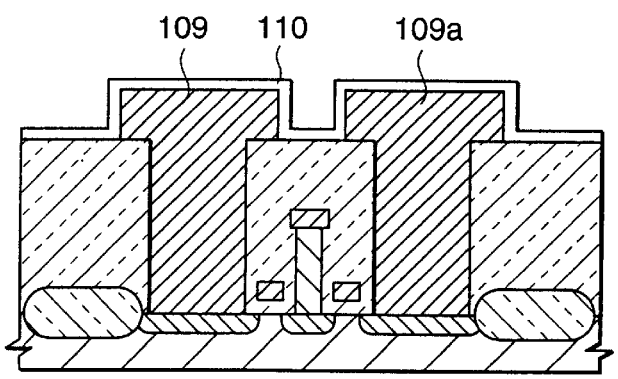
Figure 1C:
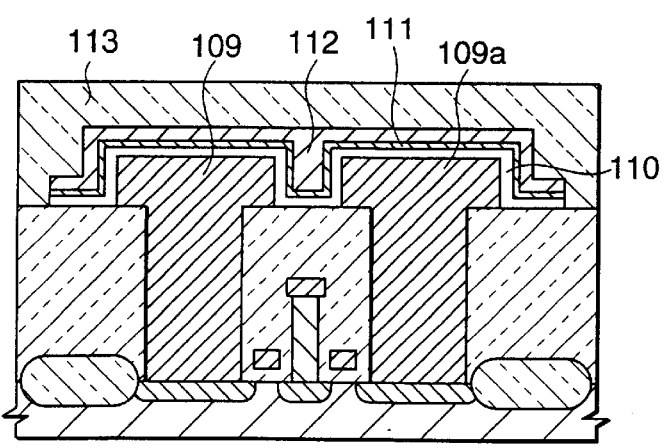
Figure 2A:
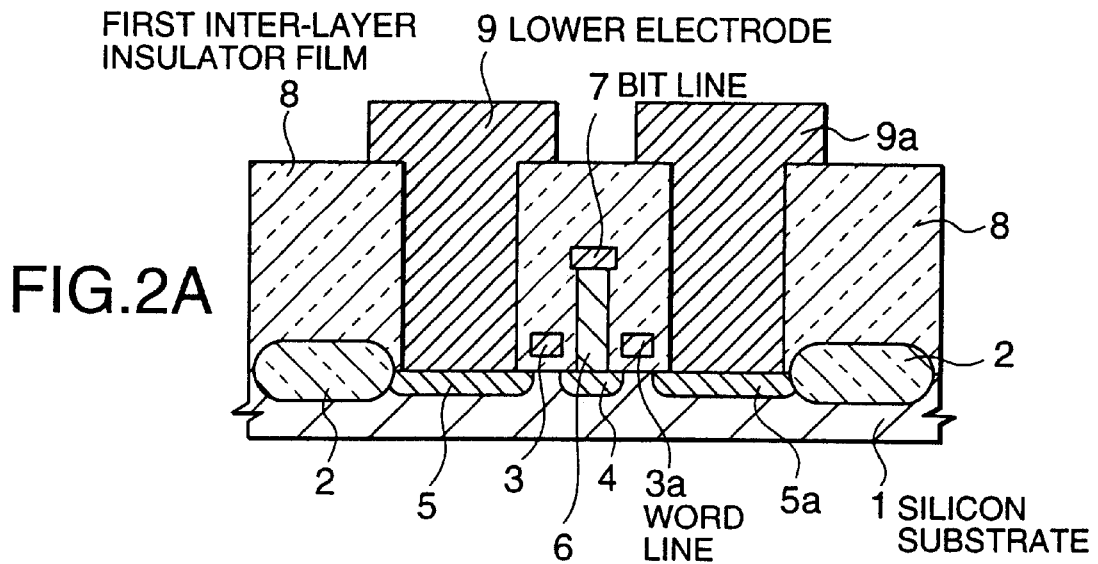
FIG. 2A to FIG. 2E are cross-sectional views showing sequential steps for manufacturing a capacitor to thereby explain a first embodiment of the invention.

As shown in FIG. 2A, similarly in the case of the prior art, an element isolating insulator film 2 is formed on a P-type substrate 1, and in an element's active region surrounded by this element isolating insulator film 2 are formed one pair of MOSFETs, gate electrodes of which constitute word lines 3 and 3a. Further, a bit-line diffused layer 4 and diffused layers 5 and 5a for connecting capacitors are formed in such a configuration that the bit-line diffused layer 4 is connected via a contact plug 6 to a bit line 7. The diffused layers 5 and 5a for connecting capacitors, on the other hand, are connected via connection holes formed in a first inter-layer insulator film 8 to lower electrodes 9 and 9a of a capacitor respectively. These lower electrodes 9 and 9a are made of a polycrystalline silicon film containing a phosphorus impurity.

Figure 2B:
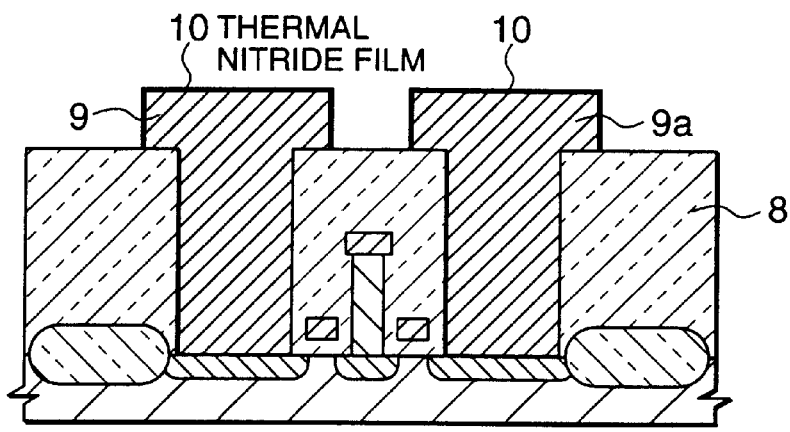

Next, as shown in FIG. 2B, a thermal nitride film 10 is formed on the surfaces of the lower electrodes 9 and 9a. Specifically, this film 10 is formed by performing rapid thermal nitridation (RTN) processing in an atmosphere of an ammonia ($NH_3$) gas at an temperature of 800° C. This thermal nitride film 10 has also an amorphous structure so it is not formed on the surface of the first inter-layer insulator film 8 but formed only locally on the surfaces of the lower electrodes 9 and 9a made of polycrystalline silicon. Note here that the thermal nitride film 10 consisting of a silicon nitride layer has a film thickness of 2–3 nm.

Figure 2C:
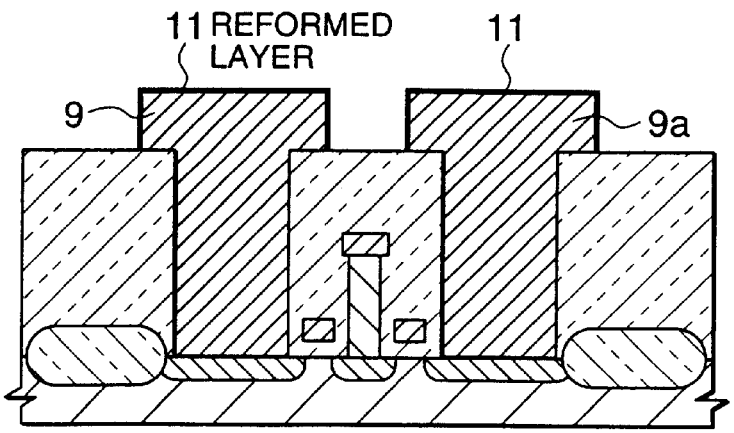

Next, as shown in FIG. 2C, the above-mentioned thermal nitride film 10 is transformed into a reformed layer 11, which provide a conductive barrier layer. This reformed layer 11 is a conductor. For example, the reformed layer 11 is a TiSiN film obtained by introducing titanium into a silicon nitride film consisting of a thermal nitride film. This reforming process is described in detail with reference to FIGS. 3 and 4 as follows. Thus, as shown in FIG. 2C, on the surfaces of the lower electrodes 9 and 9a is formed the conductive reformed layer 11 to a film thickness of about 5 nm. This reformed layer 11, that is, the conductive barrier layer 11 is amorphous and extremely thin, having very high diffusion barrier performance and oxidation resistance against oxygen ($O_2$).

Figure 2D:
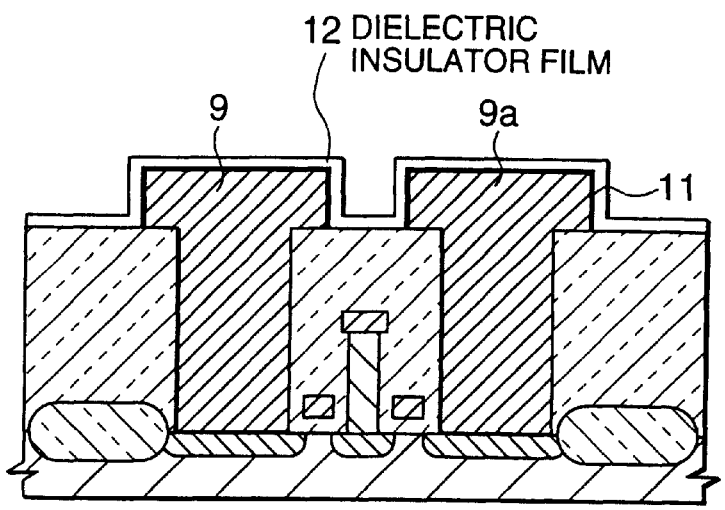

Next, as shown in FIG. 2D, a dielectric insulator film 12 is formed so as to be adhered all over the surfaces. As this dielectric insulator film 12 may be made of a barium-strontium titanate film (BST film). Besides, a highly dielectric insulator film may be made of a tantalum oxide film ($Ta_2O_5$ film), a strontium titanate film (STO film), or lead zirconate titanate film (PZT film), and heat treatment is then conducted in an oxygen atmosphere at 800° C. This oxidation processing never oxidize the surfaces of the lower electrodes 9 and 9a, because the above-mentioned reformed layer 11 has a high barrier performance against oxygen.

Figure 2E:
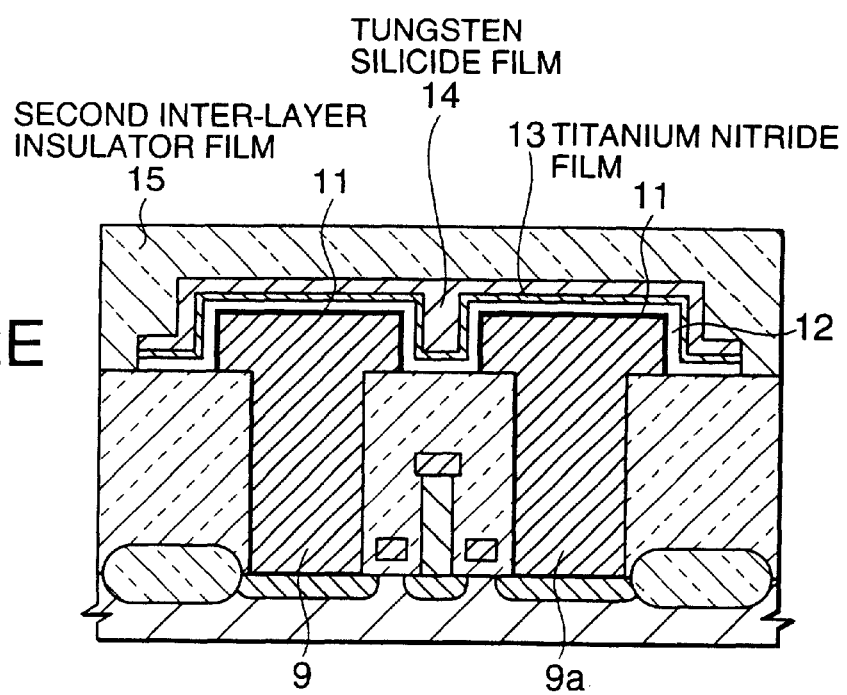

The later processes are almost the same as those described with the prior art. That is, as shown in FIG. 2E, a titanium nitride film 13 and a tungsten silicide film 14 are formed and patterned into a cell plate. Thus, one pair of capacitors are formed which comprise the lower electrodes 9 and 9a, the conductive barrier layer i.e. an extreme thin barrier metal 11,11, the dielectric insulator film 12, and the upper electrode made of the above-mentioned cell plate 13,14. In consequence, a second inter-layer insulator film 15 made of silicon oxide film is formed so as to cover all the surfaces.

In the above-mentioned embodiment, between the highly dielectric film 12 and the lower electrodes 9,9a made of polycrystalline silicon film is formed an extremely thin conductive carrier layer (TiSiN film) 11 having good step coverage. In consequence, irregularities in the film thickness are reduced to decrease the area of each memory cell capacitor, thus enabling effective utilization of the highly dielectric film.

Besides the above-mentioned embodiment employing the simple stack-type capacitor structure, an HSG (Hemi-Spherical-Si) structure of the capacitor having a larger surface area to increase the capacitance may be used, whereby the conductive barrier layer which provides an oxygen barrier layer is formed by a method for providing better step coverage, thus providing more remarkable effects of its own.

The following will describe a method, and its effects, for reforming a layer to be reformed such as the above-mentioned thermal nitride film.

FIG. 3 indicates a case where the layer to be reformed thermally reacts with an active species of a metal to thereby be transformed into a reformed layer, which is a conductor. The active species of the metal in this case may include a metal ion, an excited metal atom, and an excited metal compound. The metal compound here may be a halogen compound of a high melting-point metal, a hydrogen compound, or an organic compound.

Figure 3A:
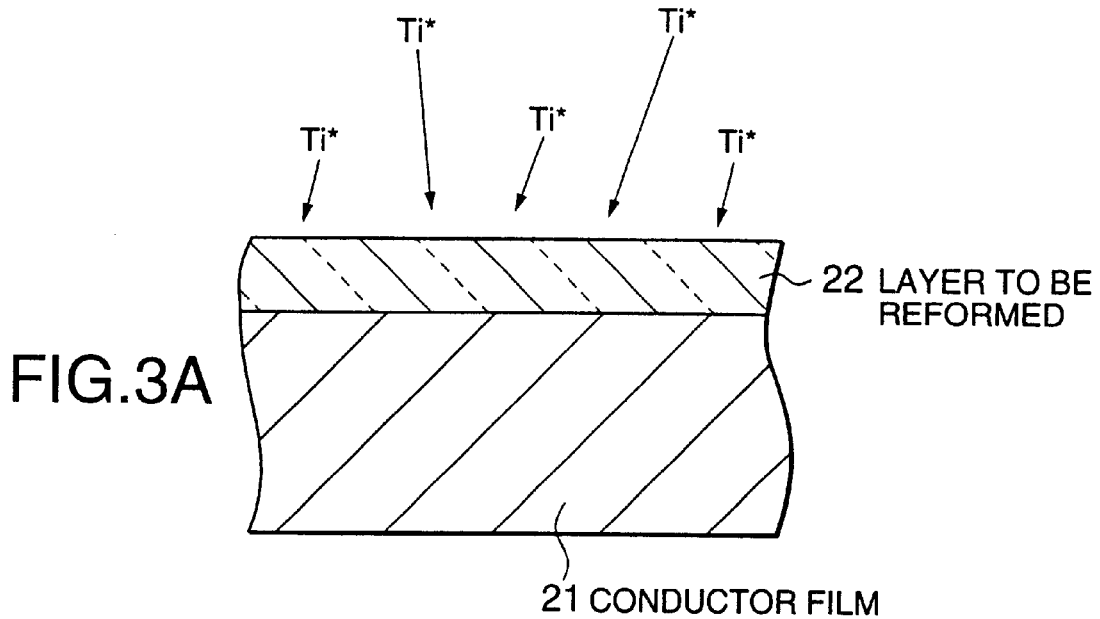
FIGS. 3A and 3B are schematic cross-sectional views explaining a method of the invention for forming a reformed layer by use of a metal.

As shown in FIG. 3A, a layer to be reformed 22 is formed on the surface of a conductor film 21. The conductor film 21, here, corresponds to the above-mentioned lower electrodes 9 and 9a and the layer to be reformed 22, to the thermal nitride film 10.

The following will describe a case where the layer to be reformed 22 is a silicon nitride film. This silicon nitride film may be, as mentioned above, formed by either thermally nitridating the surface of a poly-silicon film or performing a well-known thermal CVD method. In either case, the film needs to be formed with good step coverage.

Figure 3B:
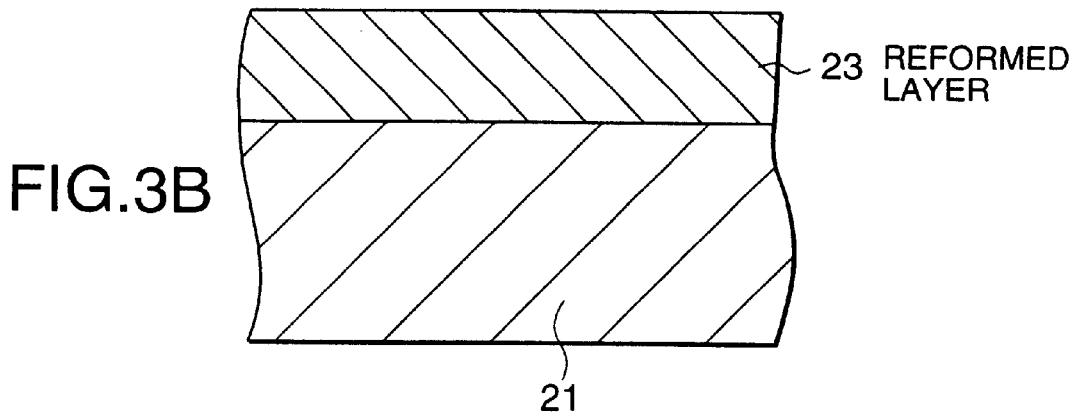

Next, as shown in FIG. 3A, the metal undergoes reaction. That is, the semiconductor substrate is put in a reaction chamber, in which the substrate is kept at a high temperature of about 600° C. and accordingly, an active species of titanium is applied onto the surface of the layer to be reformed 22 on the semiconductor substrate. By such heat treatment of the metal, as shown in FIG. 3B, the layer to be reformed 22 which is a silicon nitride film is transformed into a TiSiN film, which is a conductor. That is, a reformed layer 23 is formed as a conductive barrier layer on the conductor film 21.

The above-mentioned active species of titanium is easily produced by performing plasma excitation on a mixture gas of titanium tetra-chloride (TiCl$_4$) and Argon (Ar). For example, the above-mentioned active species of titanium can be obtained by applying a high frequency of 400 kHz on the above-mentioned mixture gas in the reaction chamber kept at a gas pressure of about 200 Pa. In this case, a neutral radical component of titanium is contained in a large quantity. Consequently, the layer to be reformed 22 is applied in an isotropic manner to be easily transformed into a TiSiN film even on the side walls of the above-mentioned lower electrodes.

Alternatively, this active species of titanium can be easily obtained by exciting the above-mentioned mixture gas using an ECR (Electron Cyclotron Resonance) method. In this case, such an active species can be easily obtained which contains a large quantity of a Ti ion. The Ti ion tends to advance straightly when it is implanted into the layer to be reformed. Therefore, the substrate temperature can be lowered to about 500° C. The reaction processing of metals by use of conventional active species of various types needs to keep the substrate at a temperature of 500° C. or higher. At such a relatively high temperature, the layer to be reformed and a metal react with each other to form a conductive barrier layer.

In the above-mentioned reaction processing of metals, it is important that a metal such as titanium should react with a layer to be reformed immediately after it is adhered onto it. That is, the metal layer must be prevented from being formed on the layer to be reformed. This can be easily done by controlling both the substrate temperature and the dose of the active species applied.

The composition of the TiSiN film thus formed by the reaction processing of a metal can be changed variously according to an employed method for forming the silicon nitride film (thermal nitridation, thermal CVD, plasma CVD, etc.) and the conditions for forming the titanium film (forming temperature, forming rate, etc.). In consequence, the composition of the TiSiN film is found, taking into account the above-mentioned barrier performance of the TiSiN film, preferable to be 25–35 atomic percent of Ti, 30–40 atomic percent of Si, and 30–40 atomic percent of N.

Figure 4A:
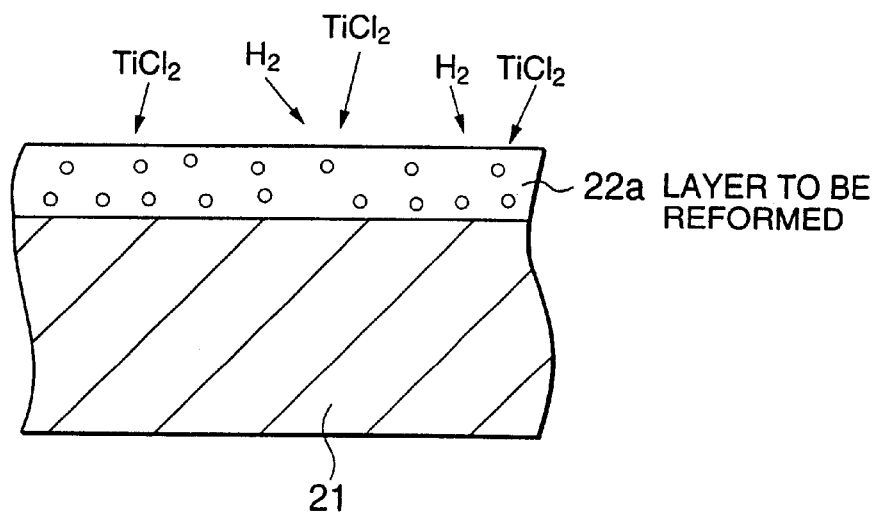
FIGS. 4A and 4B are schematic cross-sectional views explaining another method of the invention for forming a reformed layer by use of a metal.
Figure 4B:
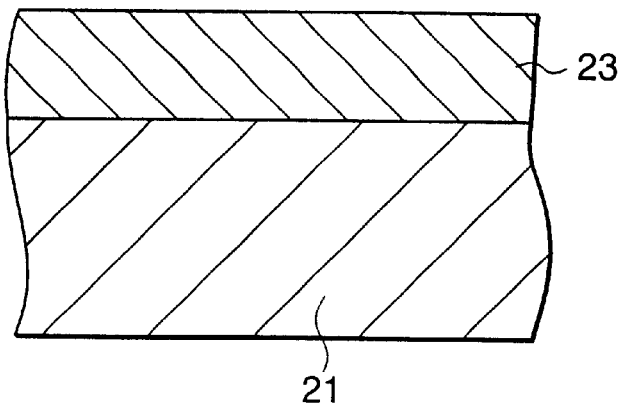

Next, the metal reaction processing in the case of FIG. 4 is described. In FIG. 4, the layer to be reformed consists of a porous insulator film, while the reformed layer is formed by performing thermal CVD on a metal compound.

The following will describe a case where the layer to be reformed 22a consists of a porous silicon nitride film. This silicon nitride film is formed by thermal nitridating the surface of a poly-silicon film containing a phosphorus impurity as mentioned above.

Next, as shown in FIG. 4A, the metal undergoes reaction processing. That is, a semiconductor substrate is put in a reaction chamber, where it is kept at a high temperature of 500° C. for example. In consequence, a mixture gas of titanium tetrachloride and hydrogen (H$_2$) is introduced into the reaction chamber. In such a manner, as shown in FIG. 4A, TiCl$_2$ is formed by thermal reaction and is adhered onto the surface of the layer to be reformed 22a. In consequence, on the surface of the layer to be reformed 22a, TiCl$_2$ reacts with H$_2$ to form Ti. Ti in turn thermally reacts with a layer to be reformed 22a to provide a TiSiN film. In this case, the layer to be reformed 22a has preferably been made porous because the above-mentioned active species has a low reactivity. Thus being porous, its reaction with a metal is promoted. Also in this case of metal reaction processing, it is important that a metal such as titanium should react with the layer to be reformed immediately after it is adhered thereon.

Second Embodiment

Figure 5E:
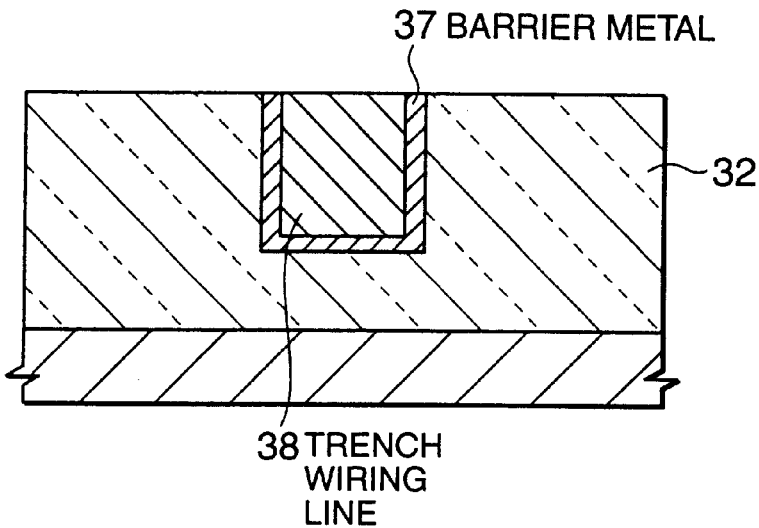
Figure 5F:
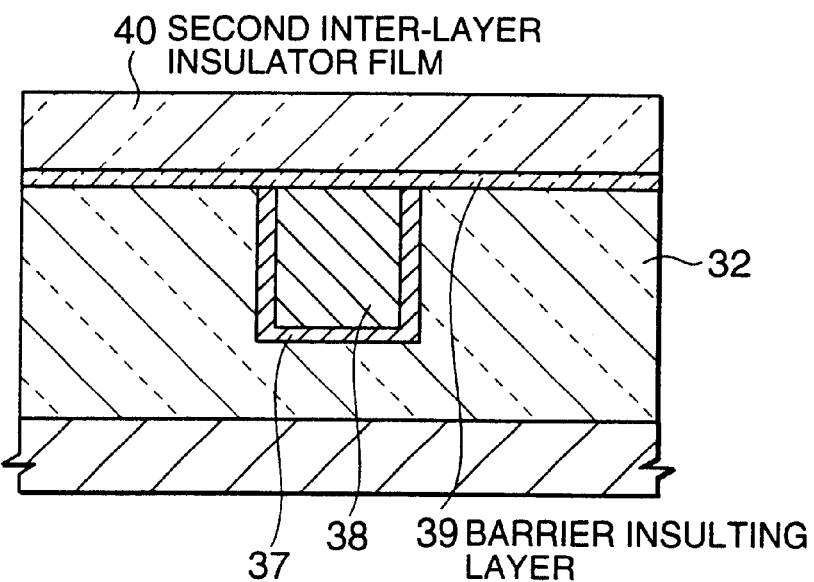

The following will describe a second embodiment of the invention with reference to FIG. 5. In this embodiment, the invention is applied to formation of a barrier metal having a copper (Cu) trench wiring line structure. FIG. 5A to FIG. 5F are cross-sectional views of sequential steps for manufacturing the trench wiring line structure.

As shown in FIG. 5A, a first inter-layer insulator film 32 is formed on a silicon substrate 31. This first inter-layer insulator film 32 is obtained by polishing and flattening, by Chemical Mechanical Polishing (CMP), the surface of a silicon oxide film deposited by CVD. In a predetermined region of the first inter-layer insulator film 32 is formed a wiring line trench 33 by photolithography and dry-etching technologies.

Next, as shown in FIG. 5B, a silicon nitride film 34 is deposited to a thickness of 5 nm all over the surface by thermal CVD. With this thermal CVD process, the silicon nitride film has very good step coverage and so is uniformly formed on the first inter-layer insulator film 32 and the inner walls of the wiring line trench.

Next, as shown in FIG. 5C, the above-mentioned silicon nitride film 34 is totally or partially transformed into a reformed layer 35, which is a conductive barrier layer. This reformed layer 35 is a TiSiN film like in the first embodiment. This reformation process is described in detail with reference to FIG. 6 as follows. This reformed layer 35 provides a barrier metal as described later.

Next, as shown in FIG. 5D, a Cu film 36 is formed by plating, to cover the reformed layer 35 and fill the wiring line trench 33.

Then, the Cu film 36 and the reformed layer 35 on the first inter-layer insulator film 32 are polished off by a publicly known CMP method. Thus, as shown in FIG. 5E, a trench wiring line 38 surrounded by a barrier metal 37 made of reformed layer 35 is formed.

Next, as shown in FIG. 5F, a barrier insulating layer 39 and a second inter-layer insulator film 40 are deposited and stacked one on the other so as to cover all over the surface. Thus, the barrier metal 37 and the barrier-insulating layer 39 are completely coated, to make up the trench wiring line structure.

According to the invention, an extremely thin and amorphous silicon nitride film is formed by thermal CVD and then transformed into a TiSiN film by its reaction with titanium. In this case, the silicon nitride film has very good step coverage. Therefore, the barrier metal 37, that is, the reformed layer 35 obtained by reforming it has very good step coverage, to thereby enable thinning of the barrier metal, thus easily preventing copper from being diffused to outside the copper wiring line trench.

Thus formed barrier metal can be applied not only to trench wiring lines but also to contact holes. Moreover, thus obtained barrier metal has conductivity and is applicable also to the formation of multi-layer wiring lines of high speeds and high reliabilities.

The following will describe a method, and its effects, for reforming the above-mentioned layer to be reformed consisting of a silicon nitride film into a conductive layer with reference to FIG. 6.

As shown in FIG. 6A, a silicon nitride film 42 is formed on an insulator film 41 by a well-known thermal CVD method. Next, a metal undergoes reaction processing. This reaction processing of the metal is performed almost the same way as described with FIG. 3. Thus, as shown in FIG.

6B, a layer to be reformed 42, which is a silicon nitride film, is partially transformed into a TiSiN film 43, which is a conductor. That is, a reformed layer 43 is formed on an non-reacted part 42a of the layer to be reformed 42 on the insulator film 41.

In this case, from a viewpoint of necessity to prevent Cu diffusion, the composition of the TiSiN film formed by reaction processing of a metal is found very preferable to be 25–35 atomic percent of Ti, 30–40 atomic percent of Si, and 30–40 atomic percent of N.

The above-mentioned embodiments have been described with a case where the layer to be reformed is a silicon nitride film and reacts with titanium metal in processing. The invention is not limited to them. In place of titanium, any other high melting-point metal may be used. Almost the same effects can be obtained if, for example, tantalum (Ta), cobalt (Co), nickel (Ni), molybdenum (Mo), or tungsten (W) may be used and the layer to be reformed, i.e. the barrier metal, may come in a film made of TaSiN, CoSiN, NiSiN, MoSiN, or WSiN. In consequence, the thus formed layer to be reformed is amorphous and conductive.

Note here that although the above-mentioned embodiments has been described in a case where a halogen compound of a high melting-point metal is plasma-excited to produce an active species, this active species may be produced by photo-excitation. Also note that in place of the above-mentioned halogen compound, a hydrogen compound or an organic compound of a high melting point metal may be used in almost the same way.

Also, as the layer to be reformed, any insulator film may be used other than a silicon nitride film. In this case, the layer to be reformed only has to be an insulating layer having high step coverage. For example, it may be a SiC film having an insulating nature.

The invention is not limited to the above-mentioned embodiments but may be changed appropriately within the scope of the technological concept thereof.

As mentioned above, according to the invention, an insulating layer with good step coverage formed on the surface of a semiconductor film on a semiconductor substrate is reformed into a conductive barrier layer. Alternatively, the insulating layer formed on the surface of the insulator film on the semiconductor substrate is totally or partially reformed into a conductive barrier. In this case, this reforming process actually involves the heating of the above-mentioned semiconductor substrate at a predetermined temperature and the application of a plasma-excited high melting-point metal onto the above-mentioned insulating layer. This high melting-point metal may include Ti, Ta, Ni, Mo, and W.

Thus, the above-mentioned conductive barrier layer formed by reforming an insulating layer has very improved step coverage. Furthermore, thus formed barrier layer is amorphous and not of a poly-crystallized structure of such as a barrier metal formed by the prior art, thus greatly improving its barrier effects, whereby the conductive layer can be easily thinned extremely.

The method according to the invention is easily applicable to the formation of capacitors or trench wiring lines of a semiconductor device. In this case, the above-mentioned effects may promote fine patterning of the layers of the semiconductor capacitors and wiring lines.

Further, those effects may also promote the integration density, the operation speed, and the multifarious functioning of the semiconductor device accompanied by promoted fine patterning thereof.

What is claimed is:

1. A method for manufacturing a semiconductor device, comprising the steps of:

forming an insulating layer on a semiconductor substrate; and applying an active species of a high melting-point metal to a surface of said insulating layer under a condition of heating said semiconductor substrate to reform said insulating layer into a conductive barrier layer, wherein said conductive barrier layer is formed on a surface of a conductor film on said semiconductor substrate, and wherein said conductor film is a polycrystalline silicon film of a lower electrode of a capacitor of said semiconductor device on said semiconductor substrate, and said insulating layer is a silicon nitride layer provided by thermal nitridation of the surface of said polycrystalline silicon film.

2. A method for manufacturing a semiconductor device according to claim 1, wherein said high melting-point metal is titanium.

3. A method for manufacturing a semiconductor device according to claim 1, further comprising a step of forming a dielectric film of said capacitor on said conductive barrier layer.

4. A method for manufacturing a semiconductor device according to claim 2, wherein said dielectric film is composed of a tantalum oxide film, a strontium titanate film, a barium-strontium titanate film, or lead zirconate titanate film.

5. A method for manufacturing a semiconductor device, comprising the steps of:

forming an insulating layer on a semiconductor substrate; and applying an active species of a high melting-point metal to a surface of said insulating layer under a condition of heating said semiconductor substrate to reform said insulating layer into a conductive barrier layer, wherein said active species of said high melting point metal is produced by plasma-exciting or by photo-exciting a halogen compound of said high melting-point metal, and wherein said insulating layer is a silicon nitride film, and said compound of said high melting point metal is titanium tetrachloride.

6. A method for manufacturing a semiconductor device according to claim 5, wherein said conductive barrier layer has a Ti—Si—N composition of 25–35 atomic percent of Ti, 30–40 atomic percent of Si, and 30–40 atomic percent of N.

* * * * *